(12) United States Patent
Yang

(10) Patent No.: US 12,189,255 B2
(45) Date of Patent: Jan. 7, 2025

(54) ARRAY SUBSTRATE AND MANUFACTURING METHOD THEREOF AND LIQUID CRYSTAL PANEL

(71) Applicant: TCL China Star Optoelectronics Technology Co., Ltd., Guangdong (CN)

(72) Inventor: Kaixiang Yang, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/614,593

(22) PCT Filed: Oct. 22, 2021

(86) PCT No.: PCT/CN2021/125462
§ 371 (c)(1),
(2) Date: Nov. 29, 2021

(87) PCT Pub. No.: WO2023/060640
PCT Pub. Date: Apr. 20, 2023

(65) Prior Publication Data
US 2024/0036422 A1   Feb. 1, 2024

(30) Foreign Application Priority Data
Oct. 12, 2021   (CN) .......................... 202111189227.1

(51) Int. Cl.
*H01L 27/12* (2006.01)
*G02F 1/1368* (2006.01)

(52) U.S. Cl.
CPC .......... *G02F 1/1368* (2013.01); *H01L 27/124* (2013.01); *H01L 27/1248* (2013.01); *H01L 27/127* (2013.01)

(58) Field of Classification Search
CPC . G02F 1/1368; H01L 27/124; H01L 27/1248; H01L 27/127
See application file for complete search history.

(56) References Cited

U.S. PATENT DOCUMENTS

| 2011/0310341 A1 | 12/2011 | Kim et al. |
| 2012/0187405 A1 | 7/2012 | Imamura |
| 2012/0314169 A1 | 12/2012 | Naoe et al. |

FOREIGN PATENT DOCUMENTS

| CN | 102703900 | 10/2012 |
| CN | 103236441 | 8/2013 |
| CN | 104867944 | 8/2015 |
| CN | 104950493 | 9/2015 |
| CN | 105068335 | 11/2015 |
| CN | 105629598 | 6/2016 |

(Continued)

OTHER PUBLICATIONS

Machine Translation of CN 111403425 (Year: 2020).*

*Primary Examiner* — Anthony Ho

(57) ABSTRACT

An array substrate, a manufacturing method thereof, and a liquid crystal display panel are provided. The array substrate includes a substrate, a transparent oxide electrode, an interface protection layer, and a first insulating layer. The transparent oxide electrode is disposed on a side of the substrate. The interface protection layer is disposed on a side of the transparent oxide electrode away from the substrate. The first insulating layer is disposed on the interface protection layer.

20 Claims, 3 Drawing Sheets

(56) References Cited

FOREIGN PATENT DOCUMENTS

| | | |
|---|---|---|
| CN | 108598093 | 9/2018 |
| CN | 109870856 | 6/2019 |
| CN | 111403425 | 7/2020 |
| CN | 112397573 | 2/2021 |
| CN | 113341624 | 9/2021 |
| KR | 10-2004-0012200 | 2/2004 |
| KR | 10-2012-0113430 | 10/2012 |
| KR | 10-2014-0090857 | 7/2014 |

* cited by examiner

ARRAY SUBSTRATE AND MANUFACTURING METHOD THEREOF AND LIQUID CRYSTAL PANEL

RELATED APPLICATIONS

This application is a National Phase of PCT Patent Application No. PCT/CN2021/125462 having International filing date of Oct. 22, 2021, which claims the benefit of priority of Chinese Patent Application No. 202111189227.1 filed on Oct. 12, 2021. The contents of the above applications are all incorporated by reference as if fully set forth herein in their entirety.

FIELD AND BACKGROUND OF THE INVENTION

The present application relates to display technologies, and more particularly, to an array substrate, a manufacturing method thereof, and a liquid crystal display panel.

In a fringe-field switching (FFS) liquid crystal display panel, a transparent electrode such as an ITO electrode is usually used as a common electrode or a pixel electrode in an array substrate.

When a chemical vapor deposition process is used to deposit an insulating layer such as a silicon nitride film on the transparent electrode, a hydrogen-containing gas in a chamber will contact an interface of the transparent electrode and cause a chemical reaction, lead to microscopic bulging on a surface of a finally formed silicon nitride film. The microscopic bulging reduces a flatness of a contact interface between the insulating layer and the transparent electrode and reduces a transmittance of the transparent electrode.

SUMMARY OF THE INVENTION

The embodiments of the present application provide an array substrate, a manufacturing method thereof, and a liquid crystal display panel to improve a flatness of a contact interface between a transparent electrode and an insulating layer in the array substrate and improve a transmittance of the transparent electrode.

One embodiment of the present application provides an array substrate including:
  a substrate;
  a transparent oxide electrode disposed on a side of the substrate;
  an interface protection layer disposed on a side of the transparent oxide electrode away from the substrate; and
  a first insulating layer disposed on a side of the interface protection layer away from the transparent oxide electrode Optionally, in some embodiments of the present application, a hydrogen content in the interface protection layer is less than a hydrogen content in the first insulating layer.

Optionally, in some embodiments of the present application, a material of the interface protection layer comprises at least one of silicon nitride, silicon oxide, silicon oxynitride, tin oxide, aluminum oxide, titanium oxide, and yttrium oxide.

Optionally, in some embodiments of the present application, a material of the transparent oxide electrode comprises indium-containing oxide, and a material of the first insulating layer comprises silicon nitride.

Optionally, in some embodiments of the present application, a thickness of the interface protection layer is less than a thickness of the first insulating layer.

Optionally, in some embodiments of the present application, a thickness of the interface protection layer ranges from 50 angstroms to 500 angstroms.

Optionally, in some embodiments of the present application, the transparent oxide electrode is a common electrode.

Optionally, in some embodiments of the present application, the array substrate further includes:
  a gate electrode comprises a first sub-gate electrode and a second sub-gate electrode arranged in a stack, wherein the first sub-gate electrode and the common electrode are arranged in a same layer and spaced apart, and wherein the second sub-gate electrode is disposed between the first sub-gate electrode and the interface protection layer;
  an active layer disposed on a side of the first insulating layer away from the interface protection layer;
  a source electrode and a drain electrode disposed on a side of the active layer away from the first insulating layer;
  a passivation layer disposed on a side of the drain electrode away from the active layer, wherein a through hole is defined in the passivation layer, and the through hole exposes the drain electrode; and
  a pixel electrode disposed on a side of the passivation layer away from the drain electrode, and the pixel electrode is connected to the drain electrode through the through hole.

Optionally, in some embodiments of the present application, the interface protection layer, the common electrode, and the gate are made of a photomask.

Optionally, in some embodiments of the present application, the array substrate further comprises:
  a gate electrode disposed on the substrate;
  a gate insulating layer disposed on a side of the gate electrode away from the substrate;
  an active layer disposed on a side of the gate insulating layer away from the gate electrode;
  a source electrode and a drain electrode disposed on the side of the active layer away from the gate insulating layer;
  a second insulating layer disposed on a side of the source electrode and the drain electrode away from the active layer, and the common electrode is positioned on a side of the second insulating layer away from the substrate; and
  a pixel electrode disposed on a side of the first insulating layer away from the interface protection layer, the array substrate is provided with a through hole, wherein the through hole sequentially penetrates the first insulating layer, the interface protection layer, and the second insulating layer, the through hole exposes the drain electrode, and the pixel electrode is connected to the drain electrode through the through hole.

Optionally, in some embodiments of the present application, the array substrate further includes:
  a gate electrode disposed on the substrate;
  a gate insulating layer disposed on a side of the gate electrode away from the substrate, the transparent oxide electrode is a pixel electrode, and the pixel electrode is positioned on a side of the gate insulating layer away from the substrate;
  an active layer disposed on the side of the gate insulating layer away from the gate electrode;
  a source electrode and the drain electrode disposed between the active layer and the interface protection layer, wherein the drain electrode extends from an end of the active layer to a side away from the source electrode, and is connected to the pixel electrode; and a common electrode disposed on the side of the first insulating layer away from the interface protection layer;

wherein the interface protection layer covers the pixel electrode, and a portion of the active layer positioned between the source electrode and the drain electrode.

The embodiments of the present application provides a liquid crystal display panel, which includes a color filter substrate, a liquid crystal, and an array substrate, wherein the liquid crystal is positioned between the color filter substrate and the array substrate, and wherein the array substrate includes:

a substrate;

a transparent oxide electrode disposed on a side of the substrate;

an interface protection layer disposed on a side of the transparent oxide electrode away from the substrate; and a first insulating layer disposed on a side of the interface protection layer away from the transparent oxide electrode Optionally, in some embodiments of the present application, a hydrogen content in the interface protection layer is less than a hydrogen content in the first insulating layer.

Optionally, in some embodiments of the present application, a material of the interface protection layer includes at least one of silicon nitride, silicon oxide, silicon oxynitride, tin oxide, aluminum oxide, titanium oxide, and yttrium oxide.

Optionally, in some embodiments of the present application, a material of the transparent oxide electrode includes indium-containing oxide, and a material of the first insulating layer includes silicon nitride Optionally, in some embodiments of the present application, a thickness of the interface protection layer is less than a thickness of the first insulating layer.

Optionally, in some embodiments of the present application, a thickness of the interface protection layer ranges from 50 angstroms to 500 angstroms.

The embodiments of the present application also provide a method of manufacturing an array substrate, which includes the following steps:

providing a substrate;

forming a transparent oxide electrode on a side of the substrate;

forming an interface protection layer on a side of the transparent oxide electrode away from the substrate; and forming a first insulating layer on a side of the interface protection layer away from the transparent oxide electrode.

Optionally, in some embodiments of the present application, the step of forming the interface protection layer on the side of the transparent oxide electrode away from the substrate includes:

depositing an interface protection material in an atmosphere of a hydrogen-containing gas with a first volume flow rate to form an interface protection layer;

the step of forming the first insulating layer on the interface protection layer includes: depositing silicon nitride in an atmosphere of a hydrogen-containing gas with a second volume flow rate to form the first insulating layer;

wherein the first volume flow rate is less than the second volume flow rate.

Optionally, in some embodiments of the present application, the hydrogen-containing gas includes silicon tetrahydride, and the interface protection material includes silicon nitride, silicon oxide or silicon oxynitride;

in the step of depositing the interface protection material in the atmosphere of the hydrogen-containing gas with the first volume flow rate, a volume flow rate of the silicon tetrahydride ranges from 50 mL/min to 2000 mL/min;

in the step of depositing silicon nitride in the atmosphere of the hydrogen-containing gas with the second volume flow rate, a volume flow rate of the silicon tetrahydride is greater than 2000 mL/min.

Compared with an array substrate in prior arts, the array substrate in the present application is provided with the interface protection layer between the transparent oxide electrode and the first insulating layer. Because the interface protection layer provides protective effect on the transparent oxide electrode, the hydrogen-containing gas in the chamber can be prevented from directly contacting the transparent oxide electrode to react during a process of forming the first insulating layer, thereby bulging on a surface of the first insulating layer can be preventing, flatness of a contact interface between the first insulating layer and the transparent oxide can be improving, and transmittance of the transparent oxide electrode can be improving.

BRIEF DESCRIPTION OF THE SEVERAL VIEWS OF THE DRAWINGS

In order to more clearly describe the technical solutions in the embodiments of the present application, the following will briefly introduce the figures used in the description of the embodiments. The figures in the following description are only some embodiments of the present application. As far as technical personnel are concerned, they can obtain other figures based on these figures without inventive steps.

DESCRIPTION OF SPECIFIC EMBODIMENTS OF THE INVENTION

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application. In addition, it should be understood that the specific implementations described here are only used to illustrate and explain the present application, and are not used to limit the present application. In the present application, unless otherwise stated, the directional words used such as "upper" and "lower" generally refer to the upper and lower directions of the device in actual use or operating state, and specifically refer to the figure directions in the figures; and "inner" and "outer" refer to the outline of the device.

The embodiments of the present application provide an array substrate and a manufacturing method thereof, and a liquid crystal display panel. Detailed descriptions are provided below. It should be noted that an order of description in the following embodiments is not meant to limit the preferred order of the embodiments.

The present application provides an array substrate, which includes a substrate, a transparent oxide electrode, an interface protection layer, and a first insulating layer. The transparent oxide electrode is disposed on a side of the substrate. The interface protection layer is disposed on a side of the transparent oxide electrode away from the substrate. The first insulating layer is disposed on a side of the interface protection layer away from the transparent oxide electrode.

Therefore, in the array substrate provided by the present application, the interface protection layer is provided between the transparent oxide electrode and the first insulating layer. Because the interface protection layer provides a protective effect on the transparent oxide electrode, it is possible to prevent the hydrogen-containing gas in the chamber from directly contacting the transparent oxide electrode to react in the process of forming the first insulating layer, thereby bulging on a surface of the first insulating layer can be preventing, flatness of a contact interface between the first insulating layer and the transparent oxide can be improving, and transmittance of the transparent oxide electrode can be improving.

Figure 1:
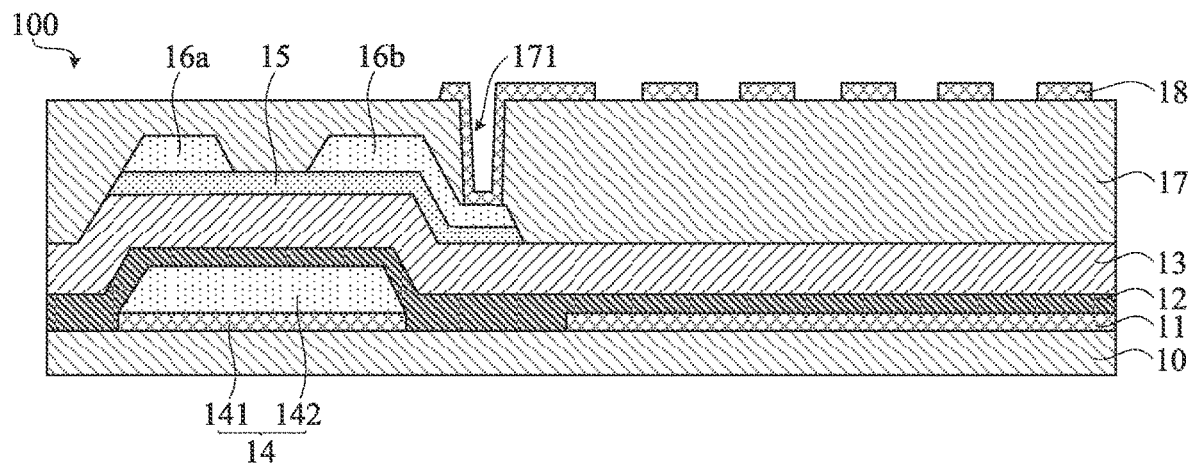
FIG. 1 is a schematic diagram of a structure of an array substrate provided by first embodiment of the present application.

Please refer to FIG. 1, the first embodiment of the present application provides an array substrate 100. The array substrate 100 includes a substrate 10, a transparent oxide electrode 11, an interface protection layer 12, and a first insulating layer 13. The transparent oxide electrode 11 is disposed on a side of the substrate 10. The interface protection layer 12 is disposed on a side of the transparent oxide electrode 11 away from the substrate 10. The first insulating layer 13 is disposed on a side of the interface protection layer 12 away from the transparent oxide electrode 11.

The substrate 10 may be a rigid substrate, such as a glass substrate. The substrate 10 may also be a flexible substrate, such as a polyimide substrate. A material of the substrate 10 is not specifically limited in the present application.

A material of the transparent oxide electrode 11 may include indium-containing oxide. In this embodiment, the material of the transparent oxide electrode 11 is indium-containing oxide. In some embodiments, the material of the transparent oxide electrode 11 may also include other materials, which will not be repeated here.

Specifically, the indium-containing oxide may be ITO or IZO. In this embodiment, the indium-containing oxide is ITO. It should be noted that, in some embodiments, the indium-containing oxide may also be other transparent oxides with a risk of precipitation, which will not be repeated here.

In this embodiment, a material of the first insulating layer 13 includes silicon nitride, and the first insulating layer 13 can be formed by a chemical vapor deposition process.

The inventor of the present application has found in a large number of experimental investigations that when a silicon nitride film layer is formed on an ITO electrode by a chemical vapor deposition process, since the deposition process is performed in a closed chamber, in order to ensure the dielectric properties of the silicon nitride film layer and the ability of blocking water and oxygen, it is usually necessary to deposit silicon nitride in a hydrogen-containing gas with a higher volume flow rate such as silicon tetrahydride and ammonia to form a dense silicon nitride film. However, in the atmosphere where the above-mentioned high-volume hydrogen-containing gas is positioned, the free electrons existing in the chamber will collide with the hydrogen-containing gas to generate a large amount of hydrogen radicals. Since hydrogen radicals have strong reducibility, at an interface of the ITO electrode, the hydrogen radicals will contact the $In^{3+}$ on a surface of the ITO electrode to cause a chemical reaction. The $In^{3+}$ is reduced to In, so that a part of In is precipitated on the surface of the ITO electrode. On the one hand, the precipitation of In will cause the light to be scattered and reflected when passing through the ITO electrode, thereby reducing a transmittance of the ITO electrode itself. On the other hand, the precipitation of In causes a bulging phenomenon of the silicon nitride film formed on the surface of the ITO electrode, and the contact interface between the silicon nitride film and the ITO electrode becomes uneven, which also reduces the transmittance of the ITO electrode.

Therefore, in this embodiment, the interface protection layer 12 is provided between the transparent oxide electrode 11 and the first insulating layer 13. In the process of forming the first insulating layer 13, the deposition process is directly on the interface protection layer 12. Therefore, the hydrogen-containing gas in the chamber does not directly contact the transparent oxide electrode 11, which can prevent the hydrogen radicals from chemically reacting with the $In^{3+}$ on the surface of the transparent oxide electrode 11, so as to avoid precipitation of In on the surface of the transparent oxide electrode 11, thereby a flatness of the contact interface between the first insulating layer 13 and the transparent oxide electrode 11 can be improving, and transmittance of the transparent oxide electrode 11 can be improving.

In this embodiment, a chemical vapor deposition process may be used to form the interface protection layer 12. A hydrogen content in the interface protection layer 12 is less than a hydrogen content in the first insulating layer 13. When a chemical vapor deposition process is used to form the interface protection layer 12, if the gas used in the chamber includes a hydrogen-containing gas, the resulting interface protection layer 12 will also contain a small amount of hydrogen. In this embodiment, by making the hydrogen content in the interface protection layer 12 less than the hydrogen content in the first insulating layer 13, a probability of $In^{3+}$ on the surface of the transparent oxide electrode 11 is reduced by hydrogen on the surface of the interface protection layer 12, thereby further reducing a precipitation probability of In on the surface of the transparent oxide electrode 11.

Specifically, a material of the interface protection layer 12 may include at least one of silicon nitride, silicon oxide, silicon oxynitride, tin oxide, aluminum oxide, titanium oxide, and yttrium oxide.

Optionally, the material of the interface protection layer 12 includes silicon nitride, silicon oxide, or silicon oxynitride. When the above three materials are selected, the interface protection layer 12 can be formed on the basis of existing equipment, without additional equipment and manufacturing procedures, which is beneficial to save process and manufacturing costs.

In this embodiment, the material of the interface protection layer 12 may be silicon nitride. Since the film forming process of silicon nitride is simple, selecting silicon nitride as the material of the interface protection layer 12 can save process manufacturing costs. The hydrogen content in the interface protection layer 12 is less than the hydrogen content in the first insulating layer 13. Therefore, in this embodiment, compared with the manufacturing process of the first insulating layer 13, a difference of the manufacturing process of the interface protection layer 12 is that during the deposition process, a volume flow rate of the hydrogen-containing gas in the chamber is reduced to form the interface protective layer 12 with a less hydrogen content. Specifically, taking the hydrogen-containing gas in the chamber including silicon tetrahydride as an example, during the manufacturing process of the first insulating layer 13, the volume flow rate of silicon tetrahydride in the chamber is greater than 2000 mL/min; during the manufacturing process of the interface protective layer 12, the volumetric flow rate of silicon tetrahydride in the chamber ranges from 50 mL/min to 2000 mL/min. In the low volume flow range of 50 mL/min to 2000 mL/min, the hydrogen radicals generated in the chamber will preferentially combine with SiNx to form SiNx:H, and the concentration of the remaining hydrogen radicals is not enough to precipitate $In^{3+}$ from the ITO lattice and agglomerate to produce macroscopically visible metallic In particles that can reduce the transmittance of film. Therefore, if the interface protection layer 12 is formed within the above-mentioned volume flow range, the transmittance of the transparent oxide electrode 11 will not be affected. It should be noted that the specific volume flow of hydrogen-containing gas needs to be adjusted in conjunction with the deposition equipment, which is not limited in the present application.

In some embodiments, the material of the interface protection layer 12 may include metal oxides such as tin oxide, aluminum oxide, titanium oxide, or yttrium oxide. While reducing the precipitation probability of In on the surface of the transparent oxide electrode 11, on the one hand, due to the good stability of the above-mentioned metal oxide, it can isolate external ions and prevent the intrusion of external ions from affecting the film performance of the interface protection layer 12. On the other hand, the above-mentioned metal oxides have a wide energy band and cannot be broken down under normal low voltage, that is, they have high dielectric properties, which can effectively prevent the interface protection layer 12 from breaking down and conducting with the nearby conductive film layer when energized.

Further, a thickness of the interface protection layer 12 is less than a thickness of the first insulating layer 13. The above configuration can avoid an occurrence of stress concentration due to the excessive thickness of the interface protection layer 12, thereby a performance of the array substrate 100 can be improving. Specifically, the thickness of the interface protection layer 12 can be 50 angstroms to 500 angstroms, such as 50 angstroms, 100 angstroms, 150 angstroms, 200 angstroms, 250 angstroms, 300 angstroms, 350 angstroms, 400 angstroms, 450 angstroms, or 500 angstroms. It should be noted that the specific thickness of the interface protection layer 12 can be set according to actual conditions, which is not limited in the present application.

With reference to FIG. 1, in this embodiment, the transparent oxide electrode 11 is a common electrode. The first insulating layer 13 is a gate insulating layer. The array substrate 100 further includes a gate electrode 14, an active layer 15, a source electrode 16a, a drain electrode 16b, a passivation layer 17, and a pixel electrode 18.

The gate electrode 14 includes a first sub-gate electrode 141 and a second sub-gate electrode 142 that are stacked. The first sub-gate electrode 141 and the common electrode 11 are arranged in the same layer and spaced apart. The first sub-gate electrode 141 and the common electrode 11 are manufactured by using a same photomask. The second sub-gate electrode 142 is disposed between the first sub-gate electrode 141 and the interface protection layer 12. A material of the second sub-gate electrode 142 may be one or more of copper, aluminum, molybdenum, and titanium.

The active layer 15 is disposed on a side of the first insulating layer 13 away from the interface protection layer 12. A material of the active layer 15 may be an oxide semiconductor material, such as indium gallium zinc oxide.

The source electrode 16a and the drain electrode 16b are disposed on the side of the active layer 15 away from the first insulating layer 13. The material of the source electrode 16a and the drain electrode 16b may be one or more of copper, aluminum, molybdenum, and titanium.

The passivation layer 17 is disposed on the side of the drain electrode 16b away from the active layer 15. A through hole 171 is defined in the passivation layer 17. The through hole 171 exposes the drain electrode 16b. A material of the passivation layer 17 may be silicon nitride.

The pixel electrode 18 is disposed on a side of the passivation layer 17 away from the drain electrode 16b. The pixel electrode 18 connects to the drain electrode 16b through the through hole 171. A material of the pixel electrode 18 may be ITO.

Figure 2:
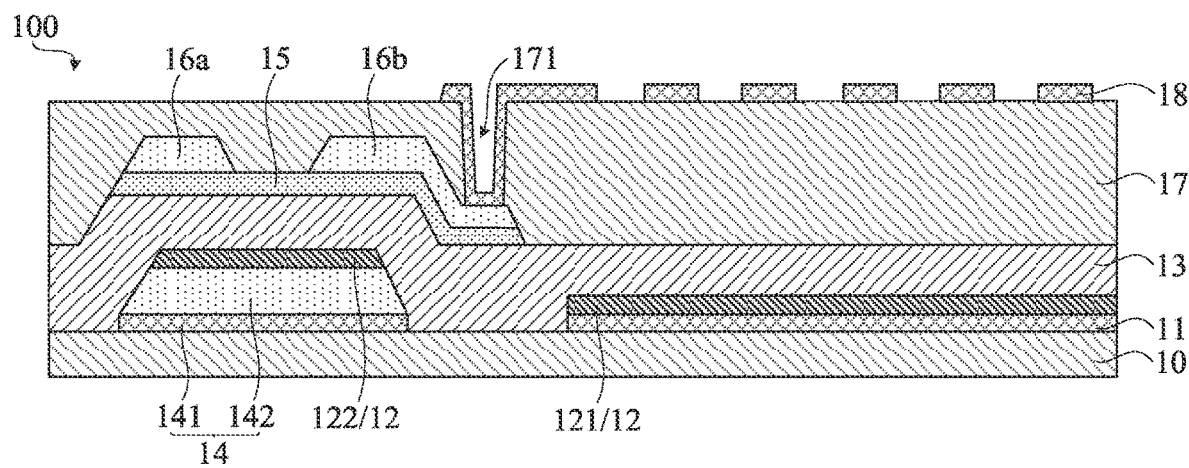
FIG. 2 is a schematic diagram of the structure of the array substrate provided by second embodiment of the present application.

Please refer to FIG. 2, a second embodiment of the present application provides an array substrate 100. A difference between the array substrate 100 provided in the second embodiment of the present application and the first embodiment is that the interface protection layer 12, the common electrode 11, and the gate electrode 14 are made of a photomask.

The interface protection layer 12 includes a first protection portion 121 and a second protection portion 122. The first protection portion 121 and the second protection portion 122 are arranged at intervals. The first protection portion 121 covers the common electrode 11. The second protection portion 122 covers the gate electrode 14. Specifically, a side surface of the first protection portion 121 is flush with aa side surface of the common electrode 11. A side surface of the second protection portion 122 is flush with a side surface of the second sub-gate electrode 142.

Figure 3:
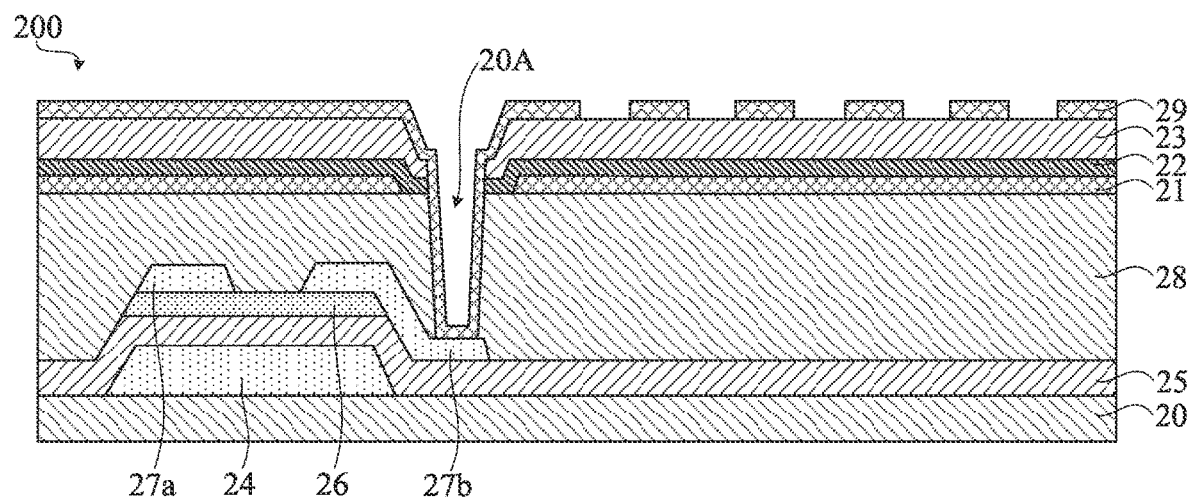
FIG. 3 is a schematic diagram of the structure of the array substrate provided by third embodiment of the present application.

Please refer to FIG. 3, a third embodiment of the present application provides an array substrate 200. The array substrate 200 includes a substrate 20, a transparent oxide electrode 21, an interface protection layer 22, and a first insulating layer 23 that are sequentially disposed.

The substrate 20 may be a rigid substrate, such as a glass substrate. The substrate 20 may also be a flexible substrate, such as a polyimide substrate. A material of the substrate 20 is not specifically limited in the present application.

The material of the transparent oxide electrode 21 may include indium-containing oxide. In this embodiment, the material of the transparent oxide electrode 21 is indium-containing oxide. In some embodiments, the material of the transparent oxide electrode 21 may also include other materials, which will not be repeated here.

Specifically, the indium-containing oxide may be ITO or IZO. In this embodiment, the indium-containing oxide is ITO. It should be noted that, in some embodiments, the indium-containing oxide may also be other transparent oxides with a risk of precipitation, which will not be repeated here.

In this embodiment, a material of the first insulating layer 23 includes silicon nitride, and the first insulating layer 23 can be formed by a chemical vapor deposition process.

The inventor of the present application has found in a large number of experimental investigations that when a silicon nitride film layer is formed on an ITO electrode by a chemical vapor deposition process, since the deposition process is performed in a closed chamber, in order to ensure the dielectric properties of the silicon nitride film layer and the ability of blocking water and oxygen, it is usually necessary to deposit silicon nitride in a hydrogen-containing gas with a higher volume flow rate such as silicon tetrahydride and ammonia to form a dense silicon nitride film. However, in the atmosphere where the above-mentioned high-volume hydrogen-containing gas is positioned, the free electrons existing in the chamber will collide with the hydrogen-containing gas to generate a large amount of hydrogen radicals. Since hydrogen radicals have strong reducibility, at an interface of the ITO electrode, the hydrogen radicals will contact the $In^{3+}$ on a surface of the ITO electrode to cause a chemical reaction. The $In^{3+}$ is reduced to In, so that a part of In is precipitated on the surface of the ITO electrode. On the one hand, the precipitation of In will cause the light to be scattered and reflected when passing through the ITO electrode, thereby reducing a transmittance of the ITO electrode itself. On the other hand, the precipitation of In causes a bulging phenomenon of the silicon nitride film formed on the surface of the ITO electrode, and the contact interface between the silicon nitride film and the ITO electrode becomes uneven, which also reduces the transmittance of the ITO electrode.

Therefore, in this embodiment, the interface protective layer 22 is disposed between the transparent oxide electrode 21 and the first insulating layer 23. In the process of forming the first insulating layer 23, the deposition process is directly on the interface protective layer 22. Therefore, the hydrogen-containing gas in the chamber does not directly contact the transparent oxide electrode 21, which can prevent the hydrogen radicals from chemically reacting with the $In^{3+}$ on the surface of the transparent oxide electrode 21, to avoid precipitation of In on the surface of the transparent oxide electrode 21, thereby a flatness of the contact interface between the first insulating layer 23 and the transparent oxide electrode 21 can be improving, and a transmittance of the transparent oxide electrode 21 can be improving.

In this embodiment, a chemical vapor deposition process may be used to form the interface protection layer 22. A hydrogen content in the interface protection layer 22 is less than a hydrogen content in the first insulating layer 23. When a chemical vapor deposition process is used to form the interface protection layer 22, if the gas used in the chamber includes a hydrogen-containing gas, the resulting interface protection layer 22 will also contain a small amount of hydrogen. In this embodiment, by making the hydrogen content in the interface protection layer 22 less than the hydrogen content in the first insulating layer 23, a probability of $In^{3+}$ on the surface of the transparent oxide electrode 21 is reduced by hydrogen on the surface of the interface protection layer 22, thereby further reducing a precipitation probability of In on the surface of the transparent oxide electrode 21.

Specifically, a material of the interface protection layer 22 may include at least one of silicon nitride, silicon oxide, silicon oxynitride, tin oxide, aluminum oxide, titanium oxide, and yttrium oxide.

Optionally, the material of the interface protection layer 22 includes silicon nitride, silicon oxide, or silicon oxynitride. When the above three materials are selected, the interface protective layer 22 can be formed on the basis of existing equipment, without additional equipment and production procedures, which is beneficial to save process and manufacturing costs.

In this embodiment, the material of the interface protection layer 22 may be silicon nitride. Since the film forming process of silicon nitride is simple, selecting silicon nitride as the material of the interface protection layer 22 can save manufacturing costs. The hydrogen content in the interface protection layer 22 is less than the hydrogen content in the first insulating layer 23. Therefore, in this embodiment, compared with the manufacturing process of the first insulating layer 23, a difference of the manufacturing process of the interface protection layer 22 is that during the deposition process, a volume flow rate of the hydrogen-containing gas in the chamber is reduced to form the interface protective layer 22 with a less hydrogen content. Specifically, taking the hydrogen-containing gas in the chamber including silicon tetrahydride and ammonia as an example, during the manufacturing process of the first insulating layer 23, the volume flow rate of silicon tetrahydride in the chamber is greater than 2000 mL/min; during the manufacturing process of the interface protective layer 22, the volumetric flow rate of silicon tetrahydride in the chamber ranges from 50 mL/min to 2000 mL/min. In the low volume flow range of 50 mL/min to 2000 mL/min, the hydrogen radicals generated in the chamber will preferentially combine with SiNx to form SiNx:H, and the concentration of the remaining hydrogen radicals is not enough to precipitate $In^{3+}$ from the ITO lattice and agglomerate to produce macroscopically visible metallic In particles that can reduce the transmittance of film. Therefore, if the interface protection layer 22 is formed within the above-mentioned volume flow range, the transmittance of the transparent oxide electrode 21 will not be affected. It should be noted that the specific volume flow of hydrogen-containing gas needs to be adjusted in conjunction with the deposition equipment, which is not limited in the present application.

In some embodiments, the material of the interface protection layer 22 may include metal oxides such as tin oxide, aluminum oxide, titanium oxide, or yttrium oxide. While reducing the precipitation probability of In on the surface of the transparent oxide electrode 21, on the one hand, due to the good stability of the above-mentioned metal oxide, it can isolate external ions and prevent the intrusion of external ions from affecting the film performance of the interface protection layer 22. On the other hand, the above-mentioned metal oxides have a wide energy band and cannot be broken down under normal low voltage, that is, they have high dielectric properties, which can effectively prevent the interface protection layer 22 from breaking down and conducting with the nearby conductive film layer when energized.

Further, a thickness of the interface protection layer 22 is less than a thickness of the first insulating layer 23. The above configuration can avoid an occurrence of stress concentration due to the excessive thickness of the interface protection layer 22, thereby the performance of the array substrate 200 can be improving. Specifically, the thickness of the interface protection layer 22 can be 50 angstroms to 500 angstroms, such as 50 angstroms, 100 angstroms, 150 angstroms, 200 angstroms, 250 angstroms, 300 angstroms, 350 angstroms, 400 angstroms, 450 angstroms, or 500 angstroms. It should be noted that the specific thickness of the interface protection layer 22 can be set according to actual conditions, which is not limited in the present application.

With reference to FIG. 3, in this embodiment, the transparent oxide electrode 21 is a common electrode. The first insulating layer 23 is a passivation layer. The array substrate 200 further includes a gate electrode 24, a gate insulating layer 25, an active layer 26, a source electrode 27a, a drain electrode 27b, a second insulating layer 28, and a pixel electrode 29.

The gate electrode 24 is provided on the substrate 20. A material of the gate electrode 24 may be one or more of copper, aluminum, molybdenum, and titanium.

The gate insulating layer 25 is disposed on a side of the gate electrode 24 away from the substrate 20. A material of the gate insulating layer 25 may be one or more of silicon nitride, silicon oxide, or silicon oxynitride.

The active layer 26 is disposed on a side of the gate insulating layer 25 away from the gate electrode 24. A material of the active layer 26 may be an oxide semiconductor material, such as indium gallium zinc oxide.

The source electrode 27a and the drain electrode 27b are disposed on a side of the active layer 26 away from the gate insulating layer 25. A material of the source electrode 27a and the drain electrode 27b may be one or more of copper, aluminum, molybdenum, and titanium.

The second insulating layer 28 is disposed on a side of the source electrode 27a and the drain electrode 27b away from the active layer 26. The common electrode 21 is positioned on a side of the second insulating layer 28 away from the substrate 20. A material of the second insulating layer 28 may be photosensitive organic resin.

The pixel electrode 29 is disposed on a side of the first insulating layer 23 away from the interface protection layer 22. The array substrate 200 is provided with a through hole 20A. The through hole 20A penetrates the first insulating layer 23, the interface protection layer 22, and the second insulating layer 28 in sequence, and exposes the drain electrode 27b. The pixel electrode 29 is connected to the drain electrode 27b through the through hole 20A. A material of the pixel electrode 29 may be ITO.

Figure 4:
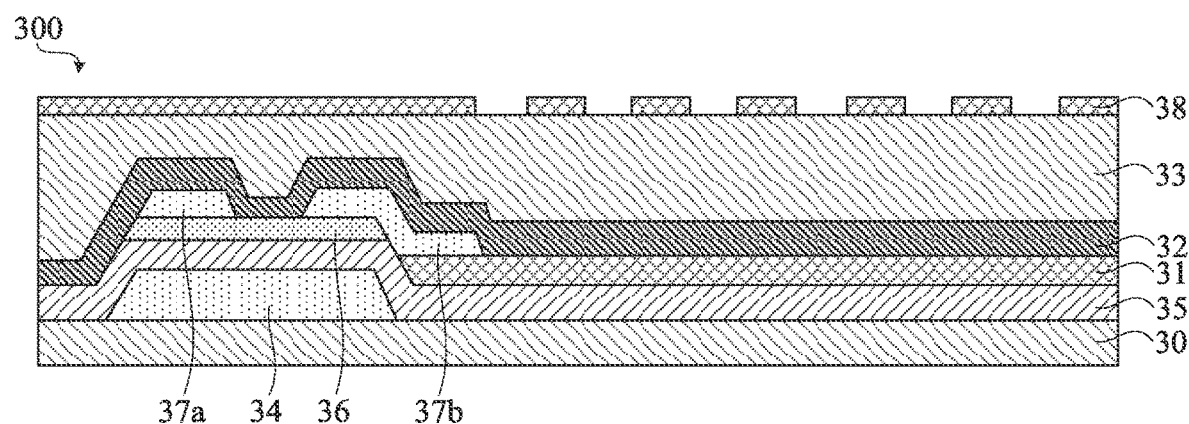
FIG. 4 is a schematic diagram of the structure of the array substrate provided by fourth embodiment of the present application.

Please refer to FIG. 4, a fourth embodiment of the present application provides an array substrate 300. The array substrate 300 includes a substrate 30, a transparent oxide electrode 31, an interface protection layer 32, and a first insulating layer 33 that are sequentially disposed.

The substrate 30 may be a rigid substrate, such as a glass substrate. The substrate 30 may also be a flexible substrate, such as a polyimide substrate. A material of the substrate 30 is not specifically limited in the present application.

A material of the transparent oxide electrode 31 may include indium-containing oxide. In this embodiment, the material of the transparent oxide electrode 31 is indium-containing oxide. In some embodiments, the material of the transparent oxide electrode 31 may also include other materials, which will not be repeated here.

Specifically, the indium-containing oxide may be ITO or IZO. In this embodiment, the indium-containing oxide is ITO. It should be noted that, in some embodiments, the indium-containing oxide may also be other transparent oxides with a risk of precipitation, which will not be repeated here.

In this embodiment, a material of the first insulating layer 33 includes silicon nitride, and the first insulating layer 33 can be formed by a chemical vapor deposition process.

The inventor of the present application has found in a large number of experimental investigations that when a silicon nitride film layer is formed on an ITO electrode by a chemical vapor deposition process, since the deposition process is performed in a closed chamber, in order to ensure the dielectric properties of the silicon nitride film layer and the ability of blocking water and oxygen, it is usually necessary to deposit silicon nitride in a hydrogen-containing gas with a higher volume flow rate such as silicon tetrahydride and ammonia to form a dense silicon nitride film. However, in the atmosphere where the above-mentioned high-volume hydrogen-containing gas is positioned, the free electrons existing in the chamber will collide with the hydrogen-containing gas to generate a large amount of hydrogen radicals. Since hydrogen radicals have strong reducibility, at an interface of the ITO electrode, the hydrogen radicals will contact the $In^{3+}$ on a surface of the ITO electrode to cause a chemical reaction. The $In^{3+}$ is reduced to In, so that a part of In is precipitated on the surface of the ITO electrode. On the one hand, the precipitation of In will cause the light to be scattered and reflected when passing through the ITO electrode, thereby reducing a transmittance of the ITO electrode itself. On the other hand, the precipitation of In causes a bulging phenomenon of the silicon nitride film formed on the surface of the ITO electrode, and the contact interface between the silicon nitride film and the ITO electrode becomes uneven, which also reduces the transmittance of the ITO electrode.

Therefore, in this embodiment, an interface protection layer 32 is provided between the transparent oxide electrode 31 and the first insulating layer 33. In the process of forming the first insulating layer 33, the deposition process is directly on the interface protection layer 32. Therefore, the hydrogen-containing gas in the chamber does not directly contact the transparent oxide electrode 31, which can prevent the hydrogen radicals from chemically reacting with the $In^{3+}$ on the surface of the transparent oxide electrode 31, so as to avoid precipitation of In on the surface of the transparent oxide electrode 31, thereby a flatness of the contact interface between the first insulating layer 33 and the transparent oxide electrode 31 can be improving, and improving transmittance of the transparent oxide electrode 31 can be improving.

In this embodiment, a chemical vapor deposition process may be used to form the interface protection layer 32. A hydrogen content in the interface protection layer 32 is less than a hydrogen content in the first insulating layer 33. When a chemical vapor deposition process is used to form the interface protection layer 32, if the gas used in the chamber includes a hydrogen-containing gas, the resulting interface protection layer 32 will also contain a small amount of hydrogen. In this embodiment, by making the hydrogen content in the interface protection layer 32 less than the hydrogen content in the first insulating layer 33, the probability of $In^{3+}$ on the surface of the transparent oxide electrode 31 is reduced by hydrogen on the surface of the interface protection layer 32, thereby further reducing a precipitation probability of In on the surface of the transparent oxide electrode 31.

Specifically, a material of the interface protection layer 32 may include at least one of silicon nitride, silicon oxide, silicon oxynitride, tin oxide, aluminum oxide, titanium oxide, and yttrium oxide.

Optionally, the material of the interface protection layer 32 includes silicon nitride, silicon oxide, or silicon oxynitride. When the above three materials are selected, the interface protection layer 32 can be formed on the basis of existing equipment, without additional equipment and manufacturing procedures, which is beneficial to save process and manufacturing costs.

In this embodiment, the material of the interface protection layer 32 may be silicon nitride. Since the film forming process of silicon nitride is simple, selecting silicon nitride as the material of the interface protection layer 32 can save process manufacturing costs. The hydrogen content in the interface protection layer 32 is less than the hydrogen content in the first insulating layer 33. Therefore, in this embodiment, compared with the manufacturing process of the first insulating layer 33, a difference of the manufacturing process of the interface protection layer 32 is that during the deposition process, a volume flow rate of the hydrogen-containing gas in the chamber is reduced to form the interface protective layer 32 with a less hydrogen content. Specifically, taking the hydrogen-containing gas in the chamber including silicon tetrahydride and ammonia as an example, during the manufacturing process of the first insulating layer 33, the volume flow rate of silicon tetrahydride in the chamber is greater than 2000 mL/min; during the manufacturing process of the interface protective layer 32, the volumetric flow rate of silicon tetrahydride in the chamber ranges from 50 mL/min to 2000 mL/min. In the low volume flow range of mL/min to 2000 mL/min, the hydrogen radicals generated in the chamber will preferentially combine with SiNx to form SiNx:H, and the concentration of the remaining hydrogen radicals is not enough to precipitate $In^{3+}$ from the ITO lattice and agglomerate to produce macroscopically visible metallic In particles that can reduce the transmittance of film. Therefore, if the interface protection layer 32 is formed within the above-mentioned volume flow range, the transmittance of the transparent oxide electrode 31 will not be affected. It should be noted that the specific volume flow of hydrogen-containing gas needs to be adjusted in conjunction with the deposition equipment, which is not limited in the present application.

In some embodiments, the material of the interface protection layer 32 may include metal oxides such as tin oxide, aluminum oxide, titanium oxide, or yttrium oxide. While reducing the precipitation probability of In on the surface of the transparent oxide electrode 31, on the one hand, due to the good stability of the above-mentioned metal oxide, it can isolate external ions and prevent the intrusion of external ions from affecting the film performance of the interface protection layer 32. On the other hand, the above-mentioned metal oxides have a wide energy band and cannot be broken down under normal low voltage, that is, they have high dielectric properties, which can effectively prevent the interface protection layer 32 from breaking down and conducting with the nearby conductive film layer when energized.

Further, a thickness of the interface protection layer 32 is less than a thickness of the first insulating layer 33. The above configuration can avoid an occurrence of stress concentration due to the excessive thickness of the interface protection layer 32, thereby the performance of the array substrate 300 can be improving. Specifically, the thickness of the interface protection layer 32 can be 50 angstroms to 500 angstroms, such as 50 angstroms, 100 angstroms, 150 angstroms, 200 angstroms, 250 angstroms, 300 angstroms, 350 angstroms, 400 angstroms, 450 angstroms, or 500 angstroms. It should be noted that the specific thickness of the interface protection layer 32 can be set according to actual conditions, which is not limited in the present application.

With reference to FIG. 4, in this embodiment, the transparent oxide electrode 31 is a pixel electrode. The first insulating layer 33 is a passivation layer. The array substrate 300 further includes a gate electrode 34, a gate insulating layer 35, an active layer 36, a source electrode 37a, a drain electrode 37b, and a common electrode 38.

The gate electrode 34 is provided on the substrate 30. A material of the gate electrode 34 may be one or more of copper, aluminum, molybdenum, and titanium.

The gate insulating layer 35 is disposed on a side of the gate electrode 34 away from the substrate 30. The pixel electrode 31 is positioned on a side of the gate insulating layer 35 away from the substrate 30. A material of the gate insulating layer 35 may be one or more of silicon nitride, silicon oxide, or silicon oxynitride.

The active layer 36 is disposed on a side of the gate insulating layer 35 away from the gate electrode 34. A material of the active layer 36 may be an oxide semiconductor material, such as indium gallium zinc oxide.

In this embodiment, the interface protection layer 32 covers the pixel electrode 31 and a portion of the active layer 36 between the source electrode 37a and the drain electrode 37b. Since a hydrogen content in the interface protection layer 32 is less than a hydrogen content in the first insulating layer 33, the interface protection layer 32 in this embodiment improves a transmittance of the pixel electrode 31 while avoiding a direct contact of the first insulating layer 33 with the active layer 36, thereby reducing a probability of hydrogen diffusing into the active layer 36, and improving an electrical performance of the thin film transistor.

The source electrode 37a and the drain electrode 37b are provided between the active layer 36 and the interface protective layer 32. The drain electrode 37b extends from a terminal of the active layer 36 to a side of the active layer 36 away from the source electrode 37a, and connects to the pixel electrode 31. A material of the source electrode 37a and the drain electrode 37b may be one or more of copper, aluminum, molybdenum, and titanium.

The common electrode 38 is disposed on a side of the first insulating layer 33 away from the interface protection layer 32. A material of the common electrode 38 may be ITO.

Figure 5:
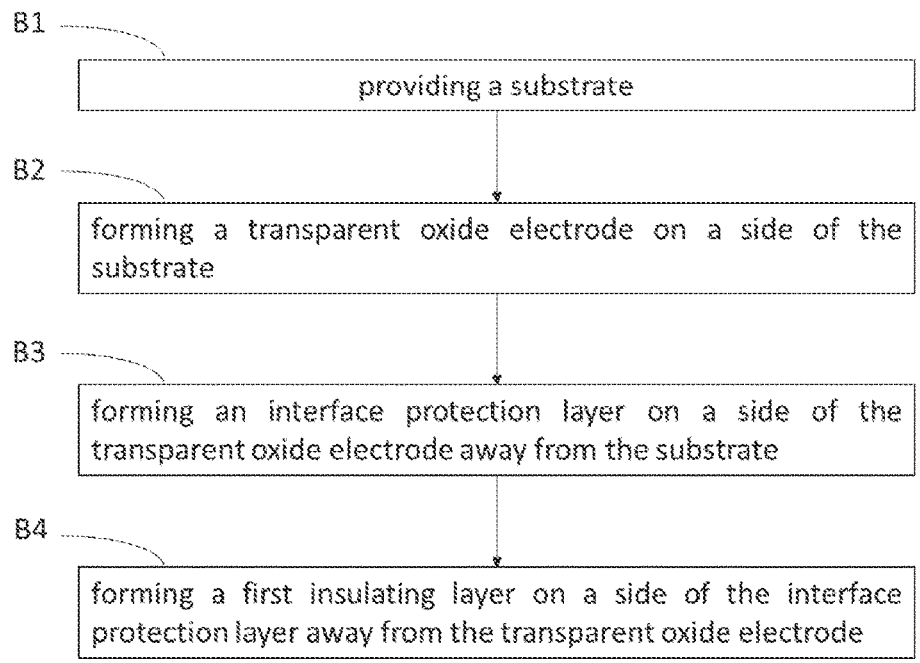
FIG. 5 is a schematic flowchart of a method of manufacturing the array substrate provided by one embodiment of the present application.

Referring to FIG. 5, one embodiment of the present application also provides a method of manufacturing an array substrate, which includes the following steps:

B1: Providing a substrate;

B2: Forming a transparent oxide electrode on a side of the substrate;

B3: Forming an interface protection layer on a side of the transparent oxide electrode away from the substrate; and B4: Forming a first insulating layer on a side of the interface protection layer away from the transparent oxide electrode.

In the manufacturing method of the array substrate provided in this embodiment, after forming the transparent oxide electrode, forming the interface protection layer on the side of the transparent oxide electrode away from the substrate, and then forming the first insulating layer on the side of the interface protection layer away from the transparent oxide electrode. In the process of forming the first insulating layer, it is possible to prevent the hydrogen-containing gas in the chamber from directly contacting the transparent oxide electrode to react, thereby bulging on a surface of the first insulating layer can be preventing, a flatness of a contact interface between the first insulating layer and the transparent oxide can be improving, and transmittance of the transparent oxide electrode can be improving.

Specifically, in step B1, the substrate may be a rigid substrate, such as a glass substrate; or, the substrate may also be a flexible substrate, such as a polyimide substrate. A material of the substrate is not specifically limited in the present application.

In step B2, the transparent oxide electrode may be a pixel electrode or a common electrode. A material of the transparent oxide electrode includes indium-containing oxide. Specifically, the indium-containing oxide may be ITO or IZO. In this embodiment, the indium-containing oxide is ITO. It should be noted that the manufacturing process of the transparent oxide electrode can refer to the prior art, which will not be repeated here.

Step B3 includes:

B31: Depositing an interface protection material in an atmosphere of a hydrogen-containing gas with a first volume flow rate to form an interface protection layer.

A material of the interface protection material may be at least one of silicon nitride, silicon oxide, silicon oxynitride, tin oxide, aluminum oxide, titanium oxide, and yttrium oxide. In this embodiment, a chemical vapor deposition process may be used to deposit the interface protection material to form the interface protection layer.

Optionally, the interface protection material is silicon nitride, silicon oxide or silicon oxynitride. When the above three materials are selected, the interface protection layer 32 can be formed on the basis of existing equipment, without additional equipment and manufacturing procedures, which is beneficial to save process and manufacturing costs. In this embodiment, the interface protection material is silicon nitride. Since the film forming process of silicon nitride is simple, the selection of silicon nitride as the interface protection material can further save the manufacturing cost of the process.

Specifically, during the deposition process of silicon nitride, the chamber contains hydrogen-containing gas, such as silicon tetrahydride and ammonia gas. A volume flow rate of silicon tetrahydride ranges from 50 mL/min to 2000 mL/min. When silicon nitride is deposited within the above range, the hydrogen radicals generated when the free electrons in the chamber collide with silicon tetrahydride will preferentially combine with SiNx to form SiNx:H, and the remaining hydrogen radical concentration is not enough to make $In^{3+}$ precipitate from the ITO lattice and agglomerate to produce macroscopically visible metal In particles which would reduce the transmittance of film. Therefore, when the interface protection layer is formed within the above-mentioned volume flow range, the transmittance of the transparent oxide electrode will not be affected.

In some specific embodiments, the volume flow rate of silicon tetrahydride may be 50 mL/min, 100 mL/min, 200 mL/min, 500 mL/min, 800 mL/min, 1000 mL/min, 1500 mL/min, or 2000 mL/min. It should be noted that the specific volume flow rate of silicon tetrahydride needs to be adjusted in conjunction with the deposition equipment, which is not limited in the present application. In addition, during the deposition of silicon nitride, other gases such as nitrogen may also be included in the chamber, which will not be repeated here.

Step B4 includes:

B41: Depositing silicon nitride in an atmosphere of a hydrogen-containing gas with a second volume flow rate to form the first insulating layer. The second volume flow rate is greater than the first volume flow rate.

A chemical vapor deposition process is used to deposit silicon nitride to form the first insulating layer. During the deposition of silicon nitride, the chamber contains hydrogen-containing gas, such as silicon tetrahydride and ammonia gas. A volume flow of silicon tetrahydride is greater than 2000 mL/min. When silicon nitride is deposited within the above range, on the one hand, because the deposition process is performed on the interface protection layer, the hydrogen radicals generated in the chamber cannot directly contact the $In^{3+}$ on the surface of the transparent oxide electrode, which can avoid a chemical reaction between hydrogen radicals and the surface of the transparent oxide electrode to avoid the precipitation of In on the surface of the transparent oxide electrode, thereby the flatness of the contact interface between the first insulating layer and the transparent oxide electrode can be improving, to increase a transmittance of the transparent oxide electrode. On the other hand, the first insulating layer formed within the above range has good dielectric properties and water and oxygen barrier properties, and will not affect the characteristics of the first insulating layer itself.

In some specific embodiments, the volume flow rate of silicon tetrahydride may be 2000 mL/min, 2200 mL/min, 2500 mL/min, 2800 mL/min, 3000 mL/min, 3200 mL/min, 3500 mL/min or 4000 mL/min. It should be noted that the specific volume flow of silicon tetrahydride needs to be adjusted in conjunction with the deposition equipment, which is not limited in the present application. In addition, during the deposition of silicon nitride, other gases such as nitrogen may also be included in the chamber, which will not be repeated here.

In this embodiment, through the manufacturing process of step B3 and step B4, a hydrogen content in the obtained first insulating layer is greater than a hydrogen content in the interface protection layer.

It should be noted that the array substrate in this embodiment may also include film layers such as gate electrode, active layer, source electrode, drain electrode, pixel electrode/common electrode, and the steps of forming the above-mentioned film layer. For related film layer structure, please refer to the structure of the array substrate described in any of the foregoing embodiments and the formation process of the related film layers are all the prior art, which will not be repeated here.

Figure 6:
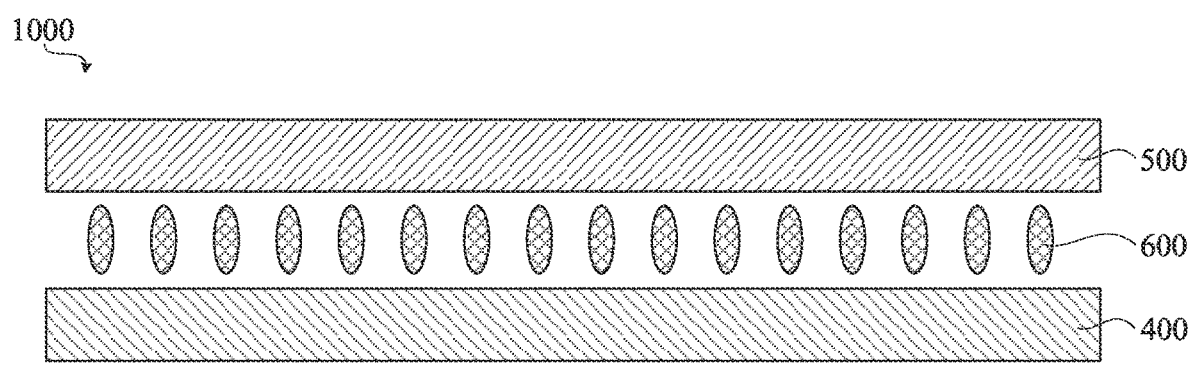
FIG. 6 is a schematic structural diagram of a liquid crystal display panel provided by one embodiment of the present application.

Please refer to FIG. 6, one embodiment of the present application also provides a liquid crystal display panel 1000, the liquid crystal display panel includes an array substrate 400 and a color filter substrate 500 disposed oppositely, and liquid crystal 600 disposed between the array substrate 400 and the color filter substrate 500.

The array substrate 400 may be the array substrate described in any of the foregoing embodiments, and the specific structure of the array substrate may refer to the description of any of the foregoing embodiments, which will not be repeated here. The specific structures of the color filter substrate 500 and the liquid crystal 600 can refer to the prior art, and will not be repeated here.

The above provides a detailed introduction to an array substrate, a manufacturing method thereof, and a liquid crystal display panel provided by the embodiments of the present application. Specific examples are used in this article to illustrate the principles and implementations of the present application. The description of the above embodiments is only used to help understand the methods and core idea of the present application. At the same time, for those skilled in the art, according to the idea of the present application, there will be changes in the specific implementation and scope of application. In summary, the content of this specification should not be construed as a limitation on the present application.

What is claimed is:

1. An array substrate comprising:
a substrate;
a transparent oxide electrode disposed on a side of the substrate, wherein the transparent oxide electrode is a common electrode;
an interface protection layer disposed on a side of the transparent oxide electrode away from the substrate;
a first insulating layer disposed on a side of the interface protection layer away from the transparent oxide electrode;
a gate electrode comprising a first sub-gate electrode and a second sub-gate electrode arranged in a stack, wherein the first sub-gate electrode and the common electrode are arranged in a same layer and spaced apart, and wherein the second sub-gate electrode is disposed between the first sub-gate electrode and the interface protection layer;
an active layer disposed on a side of the first insulating layer away from the interface protection layer;
a source electrode and a drain electrode disposed on a side of the active layer away from the first insulating layer;
a passivation layer disposed on a side of the drain electrode away from the active layer, wherein a through hole is defined in the passivation layer, and the through hole exposes the drain electrode; and
a pixel electrode disposed on a side of the passivation layer away from the drain electrode, wherein the pixel electrode is connected to the drain electrode through the through hole.

2. The array substrate according to claim 1, wherein a hydrogen content in the interface protection layer is less than a hydrogen content in the first insulating layer.

3. The array substrate according to claim 2, wherein a material of the interface protection layer comprises at least one of silicon nitride, silicon oxide, silicon oxynitride, tin oxide, aluminum oxide, titanium oxide, or yttrium oxide.

4. The array substrate according to claim 3, wherein a material of the transparent oxide electrode comprises indium-containing oxide, and a material of the first insulating layer comprises silicon nitride.

5. The array substrate according to claim 1, wherein a thickness of the interface protection layer is less than a thickness of the first insulating layer.

6. The array substrate according to claim 5, wherein the thickness of the interface protection layer ranges from 50 angstroms to 500 angstroms.

7. The array substrate according to claim 1, wherein the interface protection layer, the common electrode, and the gate are made by a same photomask.

8. A liquid crystal display panel, wherein the liquid crystal display panel comprises a color filter substrate, a liquid crystal, and the array substrate as claimed in claim 1, wherein the liquid crystal is positioned between the color filter substrate and the array substrate.

9. The liquid crystal display panel according to claim 8, wherein a hydrogen content in the interface protection layer is less than a hydrogen content in the first insulating layer.

10. The liquid crystal display panel according to claim 9, wherein a material of the interface protection layer comprises at least one of silicon nitride, silicon oxide, silicon oxynitride, tin oxide, aluminum oxide, titanium oxide, and yttrium oxide.

11. The liquid crystal display panel according to claim 10, wherein a material of the transparent oxide electrode comprises indium-containing oxide, and a material of the first insulating layer comprises silicon nitride.

12. The liquid crystal display panel according to claim 8, wherein a thickness of the interface protection layer is less than a thickness of the first insulating layer.

13. The liquid crystal display panel of claim 12, wherein the thickness of the interface protection layer ranges from 50 angstroms to 500 angstroms.

14. A method of manufacturing the array substrate as claimed in claim 1, comprising the following steps:
providing a substrate;
forming a transparent oxide electrode on a side of the substrate;
forming an interface protection layer on a side of the transparent oxide electrode away from the substrate; and
forming a first insulating layer on a side of the interface protection layer away from the transparent oxide electrode.

15. The method of manufacturing the array substrate according to claim 14, wherein the step of forming the interface protection layer on the side of the transparent oxide electrode away from the substrate comprises:
depositing an interface protection material in an atmosphere of a hydrogen-containing gas with a first volume flow rate to form the interface protection layer;
wherein the step of forming the first insulating layer on the interface protection layer comprises:
depositing silicon nitride in the atmosphere of the hydrogen-containing gas with a second volume flow rate to form the first insulating layer; and
wherein the first volume flow rate is less than the second volume flow rate.

16. The method of manufacturing the array substrate according to claim 15, wherein the hydrogen-containing gas comprises silicon tetrahydride, and the interface protection material comprises silicon nitride, silicon oxide, or silicon oxynitride;
in the step of depositing the interface protection material in the atmosphere of the hydrogen-containing gas with the first volume flow rate, a volume flow rate of the silicon tetrahydride ranges from 50 mL/min to 2000 mL/min; and
in the step of depositing silicon nitride in the atmosphere of the hydrogen-containing gas with the second volume flow rate, the volume flow rate of the silicon tetrahydride is greater than 2000 mL/min.

17. An array substrate comprising:
a substrate;
a transparent oxide electrode disposed on a side of the substrate, wherein the transparent oxide electrode is a common electrode;
an interface protection layer disposed on a side of the transparent oxide electrode away from the substrate;
a first insulating layer disposed on a side of the interface protection layer away from the transparent oxide electrode;
a gate electrode disposed on the substrate;
a gate insulating layer disposed on a side of the gate electrode away from the substrate;
an active layer disposed on a side of the gate insulating layer away from the gate electrode;

a source electrode and a drain electrode disposed on the side of the active layer away from the gate insulating layer;

a second insulating layer disposed on a side of the source electrode and the drain electrode away from the active layer, wherein the common electrode is positioned on a side of the second insulating layer away from the substrate; and a pixel electrode disposed on a side of the first insulating layer away from the interface protection layer, wherein the array substrate is provided with a through hole, the through hole sequentially penetrates the first insulating layer, the interface protection layer, and the second insulating layer, the through hole exposes the drain electrode, and the pixel electrode is connected to the drain electrode through the through hole.

18. The array substrate according to claim 17, wherein a hydrogen content in the interface protection layer is less than a hydrogen content in the first insulating layer; and a material of the interface protection layer comprises at least one of silicon nitride, silicon oxide, silicon oxynitride, tin oxide, aluminum oxide, titanium oxide, or yttrium oxide.

19. An array substrate comprising:

a substrate;

a transparent oxide electrode disposed on a side of the substrate, wherein the transparent oxide electrode is a pixel electrode;

an interface protection layer disposed on a side of the transparent oxide electrode away from the substrate;

a first insulating layer disposed on a side of the interface protection layer away from the transparent oxide electrode;

a gate electrode disposed on the substrate;

a gate insulating layer disposed on a side of the gate electrode away from the substrate, wherein the pixel electrode is positioned on a side of the gate insulating layer away from the substrate;

an active layer disposed on the side of the gate insulating layer away from the gate electrode;

a source electrode and the drain electrode disposed between the active layer and the interface protection layer, wherein the drain electrode extends from an end of the active layer to a side away from the source electrode and is connected to the pixel electrode; and a common electrode disposed on a side of the first insulating layer away from the interface protection layer;

wherein the interface protection layer covers the pixel electrode, and a portion of the active layer is positioned between the source electrode and the drain electrode.

20. The array substrate according to claim 19, wherein a hydrogen content in the interface protection layer is less than a hydrogen content in the first insulating layer; and a material of the interface protection layer comprises at least one of silicon nitride, silicon oxide, silicon oxynitride, tin oxide, aluminum oxide, titanium oxide, or yttrium oxide.

* * * * *